United States Patent
Yoon et al.

(10) Patent No.: US 10,177,261 B2
(45) Date of Patent: Jan. 8, 2019

(54) TRANSPARENT ELECTRODE COMPRISING DOPED GRAPHENE, PROCESS OF PREPARING THE SAME, AND DISPLAY DEVICE AND SOLAR CELL COMPRISING THE ELECTRODE

(75) Inventors: Seon-Mi Yoon, Yongin-si (KR); Won-mook Choi, Hwaseong-si (KR); Hyeon-jin Shin, Suwon-si (KR); Jae-young Choi, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 1717 days.

(21) Appl. No.: 13/253,437

(22) Filed: Oct. 5, 2011

(65) Prior Publication Data

US 2012/0080086 A1 Apr. 5, 2012

(30) Foreign Application Priority Data

Oct. 5, 2010 (KR) .................. 10-2010-0096919
Jun. 22, 2011 (KR) .................. 10-2011-0060795

(51) Int. Cl.
*B32B 9/00* (2006.01)
*H01L 31/0224* (2006.01)
*H01L 31/18* (2006.01)
*B82Y 30/00* (2011.01)

(52) U.S. Cl.
CPC .. *H01L 31/022466* (2013.01); *H01L 31/1884* (2013.01); *B82Y 30/00* (2013.01); *Y02E 10/50* (2013.01); *Y10T 428/26* (2015.01); *Y10T 428/30* (2015.01)

(58) Field of Classification Search
CPC .. C01B 31/0438; C01B 2204/00; B82Y 30/00
USPC .......................................... 428/408; 252/500
See application file for complete search history.

(56) References Cited

U.S. PATENT DOCUMENTS

| 7,776,444 B2 | 8/2010 | Rinzler et al. |
| 2009/0071533 A1 | 3/2009 | Choi et al. |
| 2009/0146111 A1* | 6/2009 | Shin ............... B82Y 30/00 252/510 |
| 2012/0003438 A1* | 1/2012 | Appleton ............. H01L 29/16 428/195.1 |

FOREIGN PATENT DOCUMENTS

| JP | 2008056950 A | 3/2008 |
| KR | 20040055622 A | 6/2004 |
| KR | 2009-0028007 A | 3/2009 |
| KR | 20090059871 A | 6/2009 |
| KR | 20090108459 A | 10/2009 |

(Continued)

OTHER PUBLICATIONS

European Search Report dated Apr. 24, 2013, issued in European Application No. 11183985.8.

(Continued)

*Primary Examiner* — Daniel H Miller
(74) *Attorney, Agent, or Firm* — Harness, Dickey & Pierce, P.L.C.

(57) ABSTRACT

A transparent electrode on at least one surface of a transparent substrate may include graphene doped with a p-dopant. The transparent electrode may be efficiently applied to a variety of display devices or solar cells.

28 Claims, 4 Drawing Sheets

(56) References Cited

FOREIGN PATENT DOCUMENTS

KR 20100031475 A 3/2010

OTHER PUBLICATIONS

Guoqing Xin et al., "A Graphene Sheet Exfoliated with Microwave Irradiation and Interlinked by Carbon Nanotubes for High-Performance Transparent Flexible Electrodes," *IOP Publishing Ltd.*, Sep. 8, 2010, pp. 1-7.

Zongyou Yin, et al., "Organic Photovoltaic Devices Using Highly Flexible Reduced Graphene Oxide Films as Transparent Electrodes," *ACS Nano*, vol. 4, No. 9, pp. 5263-5268 (2010).

M. Dragoman, et al., "Graphene-based quantum electronics," *Progress in Quantum Electronics*, vol. 33, pp. 165-214 (2009).

Z.W. Zhang, et al., "Graphene Nanosheet Counter-Electrodes for Dye-Sensitized Solar Cells," Nanoelectronics Conference (INEC), $3^{rd}$ International, IEEE, Piscataway, NJ USA, pp. 610-611 (Jan. 3, 2010).

Chen, et al. "Surface Transfer p-Type Doping of Epitaxial Graphene," Journal of American Chemical Society, vol. 129, pp. 10418-10422 (2007).

"Charge-transfer complex," Wikipedia, <http://en.wikipedia.org/wiki/Charge-transfer_complex>, pp. 1-7, (2016).

"Dye Structure and Colour," <http://stainsfile.info/StainsFile/dyes/dyecolor.htm pp. 1-7>, (2016).

Kasry, et al. "Chemical Doping of Large-Area Stacked Graphene Films for Use as Transparent, Conducting Electrodes," American Chemical Society, vol. 4, No. 7, pp. 3839-3844 (2010).

Shi, et al. "Work Function Engineering of Graphene Electrode via Chemical Doping," American Chemical Society, vol. 4, No. 5, pp. 2689-2694 (2010).

Korean Office Action dated Jun. 14, 2017 issued in corresponding Korean Application No. 10-2011-0060795 (with English translation).

\* cited by examiner

TRANSPARENT ELECTRODE COMPRISING DOPED GRAPHENE, PROCESS OF PREPARING THE SAME, AND DISPLAY DEVICE AND SOLAR CELL COMPRISING THE ELECTRODE

CROSS-REFERENCE TO RELATED APPLICATIONS

This application claims the benefit of Korean Patent Application Nos. 10-2010-0096919, filed on Oct. 5, 2010, and 10-2011-0060795, filed on Jun. 22, 2011, in the Korean Intellectual Property Office, the disclosure of each of which is incorporated herein in its entirety by reference.

BACKGROUND

1. Field

Example embodiments relate to a transparent electrode including doped graphene, a process of preparing the same, and a display device and a solar cell including the electrode, and more particularly, to a transparent electrode including doped graphene and having relatively low sheet resistance and relatively high stability when exposed to air in which reduction of transmittance is prevented or inhibited, a process of preparing the same, and a display device and a solar cell including the electrode.

2. Description of the Related Art

Display devices or solar cells include transparent electrodes, and indium tin oxide (ITO) is widely used for a transparent electrode. With increased utilization of indium, the use of ITO is becoming uneconomical. Also, when an electrode formed of ITO is bent, cracks occur therein due to insufficient flexibility, thereby increasing the resistance of the electrode. Accordingly, there is a need to develop a material that replaces ITO for forming an electrode, and research into graphene has been conducted.

Because graphene has metallic or semiconducting properties, sheet resistance may be reduced by increasing density of a carrier embodied by charge transfer between graphene and adsorbed dopants. However, transmittance of visible light is an important factor in regard to a transparent electrode of various display devices. Transmittance of light is reduced by about 2.3% while light passes through a mono-layer of graphene. In order to achieve the requirement of transmittance for a transparent electrode of a display device, the number of layers of graphene may be limited. As a result, sheet resistance suitable for the transparent electrode cannot be obtained.

Nitric acid that is commonly used as a dopant to improve electrical properties of graphene reduces sheet resistance without reducing transmittance. However, nitric acid has relatively low stability when exposed to air because nitric acid evaporates in air due to its relatively low molecular weight. Gold (III) chloride ($AuCl_3$), which is also commonly used as a dopant, absorbs visible light by transition between d-orbitals contained in Au ions. Thus, transmittance may be reduced after a doping process. Therefore, transmittance of doped graphene is reduced.

SUMMARY

Example embodiments provide a transparent electrode including graphene having improved optical and electrical properties. Example embodiments also provide a display device or a solar cell including the transparent electrode. Example embodiments also provide a process of preparing the transparent electrode. Example embodiments also provide a transparent thin film including graphene having desirable optical and electrical properties.

Additional aspects will be set forth in part in the description which follows and, in part, will be apparent from the description, or may be learned by practice of example embodiments.

According to example embodiments, a transparent electrode may be on at least one surface of a transparent substrate. The graphene may be doped with a p-dopant. The p-dopant may be an acid having a molecular weight of about 120 or more, and a transmittance variation rate of the doped graphene from before and after the graphene is doped with the p-dopant may be about 1% or less.

According to example embodiments, a display device or a solar cell may include the transparent electrode of example embodiments.

According to example embodiments, a process of preparing a transparent electrode may include forming a transparent electrode by transferring graphene onto a transparent substrate, and doping the graphene with a p-dopant solution to obtain doped graphene. The p-dopant solution may be an acid having a molecular weight of about 120 or greater, and a transmittance variation rate of the graphene from before and after the graphene is doped with the p-dopant solution is about 1% or less.

According to example embodiments, a thin film may be on at least one surface of a transparent substrate. The graphene may be doped with a p-dopant. The p-dopant may be an acid having a molecular weight of about 120 or greater, and a transmittance variation rate of the graphene from before and after the graphene is doped with the p-dopant is about 1% or less.

BRIEF DESCRIPTION OF THE DRAWINGS

These and/or other aspects will become apparent and more readily appreciated from the following description of example embodiments, taken in conjunction with the accompanying drawings of which.

DETAILED DESCRIPTION

Reference will now be made in detail to example embodiments, examples of which are illustrated in the accompanying drawings, wherein like reference numerals refer to like elements throughout. In this regard, example embodiments may have different forms and should not be construed as being limited to the descriptions set forth herein. Accordingly, example embodiments are merely described below, by referring to the figures, to explain aspects of the present description.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

In a transparent electrode including graphene formed on at least one surface of a substrate, sheet resistance of the transparent electrode may be reduced and stability thereof when exposed to air may be improved without reducing transmittance by doping the graphene with a p-dopant.

The term "graphene" used herein refers to a polycyclic aromatic molecule formed from a plurality of carbon atoms covalently bonded to each other. The covalently bonded carbon atoms may form a 6-membered ring as a repeating unit, or may further include a 5-membered ring and/or a 7-membered ring. Accordingly, in the graphene, the covalently bonded carbon atoms (generally, $sp^2$ bond) appear to form a mono-layer. The graphene may have various structures which are determined according to the amount of the 5-membered rings and/or 7-membered rings which may be contained in the graphene. The graphene electrode may have a mono-layered structure or a multi-layered structure in which a plurality of layers are stacked.

In general, light transmittance may be reduced by about 2.3% while light passes through a graphene mono-layer. The light transmittance may be reduced by about 9.2% while light passes through a multi-layered structure, for example, stacked graphene with 4 layers. Thus, as the number of graphene layer contained in the transparent electrode increases, the transmittance of graphene electrode may be reduced, thereby reducing transparency of the transparent electrode.

Graphene electrode having a light transmittance of about 75% or greater, for example, in the range of about 90 to 99%, may be used in the transparent electrode. With sufficient light transmittance, photoelectric efficiency may be improved.

The p-dopant with which the graphene is doped induces electrical interaction with graphene due to a redox potential difference, resulting in doping the graphene. As a result, carrier density increases, so that sheet resistance of the graphene may be reduced. However, if the graphene is doped with a general dopant, a trade-off effect occurs between transmittance and conductivity. If excess dopant is used in order to improve conductivity, i.e., to reduce sheet resistance, transmittance may be reduced, resulting in reduced photoelectric efficiency. On the other hand, if the amount of the dopant is reduced in order to maintain transmittance, obtaining a desired reduction in conductivity may be difficult.

According to example embodiments, the sheet resistance of graphene may be reduced without reducing transmittance by using a material that does not absorb visible light in the same amount as the p-dopant. Accordingly, the transparent electrode including the doped graphene may have improved optical properties (transmittance) and improved electric properties (sheet resistance).

The term "doped graphene" used herein refers to graphene having an effective doping effect due to the dopant, and examples of the doping effect include an increase in conductivity, i.e., a reduction in sheet resistance. As the effective doping effect of doped graphene, the sheet resistance reduction rate by the doping may be about 20% or greater, in the range of about 20% to about 90%, or in the range of about 20% to about 80%. The sheet resistance reduction rate may be calculated using Equation 1 below as a percentage of a difference between a sheet resistance measured right after a doping process and a sheet resistance measured before the doping process.

Sheet resistance reduction rate (%)=absolute value of {(sheet resistance of doped graphene after a doping process–sheet resistance of graphene before the doping process)}/sheet resistance of graphene before the doping process*100}    Equation 1

As described above, while the conductivity of graphene doped with the p-dopant according to example embodiments is increased and sheet resistance is reduced, transmittance may not be reduced after the doping process. Thus, the transmittance variation rate may be in the range of about 0% to about 0.5%, or about 0.001% to about 0.3%. The transmittance variation rate may be calculated using Equation 2 below as a percentage of a difference between a transmittance of graphene before a doping process and a transmittance of the graphene after the doping process.

Transmittance variation rate (%)=(transmittance of graphene before a doping process–transmittance of graphene after the doping process)/transmittance of graphene after the doping process*100    Equation 2

As such, by doping graphene with the p-dopant, reduction in light transmittance of the graphene may be prevented or inhibited, and thus, sheet resistance may be reduced. Because graphene electrode has sufficient conductivity due to the reduction in sheet resistance, the number of graphene layers may be reduced. Accordingly, the transparent electrode may have a relatively high light transmittance.

The p-dopant may be an acid having a molecular weight of about 120 or greater, for example, in the range of about 120 to 400. The acid may be an organic acid or an inorganic acid. If the molecular weight of the acid is within the range described above, the acid is prevented or inhibited from being evaporated in graphene, and thus, stability of the p-dopant may be improved when exposed to air. Thus, the change of sheet resistance of graphene doped with the p-dopant is inhibited. The change of sheet resistance may be represented by a sheet resistance variation rate. The sheet resistance variation rate may be calculated using Equation 3 below as a percentage of a difference between a sheet resistance measured after placing the doped graphene in an air atmosphere for about 14 days and a sheet resistance right after the doping process. Thus, a relatively low sheet resistance variation rate indicates relatively high stability when exposed to air.

Sheet resistance variation rate (%)=(a sheet resistance measured after placing the doped graphene in an air atmosphere for 14 days–sheet resistance right after the doping process)/sheet resistance right after the doping process*100    Equation 3

If graphene is doped with the p-dopant having the molecular weight in the range described above, the sheet resistance variation rate of the doped graphene may be about 25% or less, for example, in the range of about 10% to 20%.

The p-dopant may be an organic acid or inorganic acid, and the organic acid or inorganic acid may include a metal ion. The metal ion may be prepared by substituting a hydrogen ion contained in the organic acid or inorganic acid or may exist in the form of a metal complex.

The metal ion may be a metal ion in which transition between d-orbitals does not occur, because the transition absorbs light in a visible radiation. For example, a metal ion having d-orbitals fully filled with electrons may be used. The metal ion having d-orbitals filled with electrons may be $Ag^+$, $Zn^{2+}$, $Ce^{3+}$, $K^+$, a Lanthanum group metal ion, and an actinium (Ac) group metal ion.

The organic acid is a compound including carbon, hydrogen, and oxygen. In the compound, hydrogen atoms may be substituted with halogen elements, and carbon atoms contained in the compound may be bonded to each other only by single bonds. If the carbon atoms are bonded to each other by single bonds, transitions, e.g., $\pi \rightarrow \pi^*$ and $n \rightarrow \pi^*$, do not occur. Thus, visible light absorption may be inhibited. Accordingly, reduction in the transmittance of the doped graphene may be prevented or inhibited.

Examples of the organic acid may be an organic material including an electron withdrawing group and may include at least one selected from the group consisting of oxalic acid-based organic acid, lactic acid-based organic acid, propionic acid-based organic acid, acetic acid-based organic acid, citric acid-based organic acid, and trifluoroacetate-based organic acid. However, example embodiments are not limited thereto.

Examples of the oxalic acid-based organic acid include oxalyl chloride and oxalyl bromide, examples of the lactic acid-based organic acid include silver lactate, examples of the propionic acid-based organic acid include silver pentafluoropionate, examples of the acetic acid-based organic acid include methyl chlorooxoacetate and ethyl chlorooxoacetate, and examples of the citric acid-based organic acid include citric acid, lithium citrate, potassium citrate, and zinc citrate. Examples of the trifluoroacetate-based organic acid include cesium trifluoroacetate, ethyl trifluoroacetate, trifluoroacetate anhydride, silver trifluoroacetate, anhydride of trifluoroacetate and trifluoromethane sulfonic acid ($CF_3SO_3COCF_3$).

As the p-dopant with which the graphene is doped, the inorganic acid having a molecular weight of about 120 or greater may include an electron withdrawing group and examples thereof may include triflate-based ($CF_3SO_3^-$) inorganic acid, sulfonimide-based inorganic acid, sulfonamide-based inorganic acid, tetrafluoroborate-based inorganic acid, perchlorate-based inorganic acid, hexafluorophosphate-based inorganic acid, fluoroantimonate-based inorganic acid, silver-based inorganic acid, and tellurium-based inorganic acid. However, example embodiments are not limited thereto.

Examples of the triflate-based inorganic acid include silver trifluoromethane sulfonate, scandium (III) triflate, and trifluoromethane sulfonic acid anhydride.

Examples of the sulfonimide-based inorganic acid include bis(trifluoromethane)sulfonimide(($CF_3SO_2)_2NH$), bis(trifluoromethane)sulfonimide lithium salt, silver bis(trifluoromethane sulfonimide), bis(pentafluoroethyl sulfonyl)imide, and nitrosylbis(trifluoromethane)sulfonimide.

Examples of the sulfonamide-based inorganic acid include trifluoromethane sulfonamide and 2,2,2-trichloroethoxysulfonamide.

Examples of the tetrafluoroborate-based acid include nitrosyl tetrafluoroborate, nitronium tetrafluoroborate, and silver tetrafluoroborate.

Examples of the perchlorate-based inorganic acid include silver perchlorate.

Examples of the hexafluorophosphate-based inorganic acid include potassium hexafluorophosphate, silver hexafluorophosphate, hexafluorophosphoric acid, and lithium hexafluorophosphate.

Examples of the fluoroantimonate-based inorganic acid include fluoroantimonate ($HSbF_6$), nitronium hexafluoroantimonate, nitrosonium hexafluoroantimonate, potassium hexafluoroantimonate, fluorosulfuric acid-antimony pentafluoride, and silver hexafluoroantimonate.

Examples of the silver-based inorganic acid include silver nitrate, silver sulfate, silver thiocyanate, silver hexafluorophosphate, silver hexafluoroantimonate, silver hexafluoroarcenate, silver cyanide, silver tetrafluoroborate, and silver perchlorate.

Examples of the tellurium-based inorganic acid include teflic acid and telluric acid.

The inorganic acids described above may include carbon atoms that are saturated (i.e., that are bonded to each other only by single bonds). If there are unsaturated carbon atoms, for example, there are double bonds or triple bonds in the inorganic acid, visible light is absorbed due to transitions, e.g., $\pi \rightarrow \pi^*$ and $n \rightarrow \pi^*$, so that transmittance of graphene may be reduced. Accordingly, if an inorganic acid not having unsaturated carbon atoms is used as the p-dopant, visible light absorption may be inhibited, resulting in the prevention or inhibition of a reduction in transmittance.

At least one of the organic acids or inorganic acids may be used, or a combination of at least two thereof may be used.

Graphene may be doped with an appropriate amount of the p-dopant including the organic acid or inorganic acid. The amount of the p-dopant applied to a mono-layered graphene having a size of 1 cm×1 cm may be in the range of about 0.000025 to 0.0175 mmol/cm$^2$, for example, about 0.000125 to 0.00875 mmol/cm$^2$, for a sufficient doping effect and cost-effectiveness.

Meanwhile, if excess p-dopant is applied to the graphene, the dopant which is not doped may remain on the surface of the graphene. The undoped dopant may form a thin coating layer to function as a passivation layer that prevents or inhibits evaporation of the doped dopant thereunder.

In the transparent electrode including the graphene doped with the p-dopant as described above, sheet resistance may be reduced, but light transmittance may not be reduced. The light transmittance of the graphene doped with the p-dopant may be about 75% or greater, for example, in the range of about 90% to 99%.

In addition, transmittance may not be reduced in the graphene electrode doped with the p-dopant. Thus, the light transmittance reduction rate of the doped graphene may be in the range of about 0% to about 0.5%, or about 0.001% to about 0.3% when compared with undoped graphene electrode.

As such, by doping graphene with the p-dopant, light transmittance of the graphene may not be reduced, and sheet resistance may be reduced. Due to the reduction in sheet resistance of the graphene electrode, the number of graphene layers may be reduced. Accordingly, the transparent electrode may have a higher light transmittance.

The sheet resistance of the graphene electrode doped with the p-dopant may be about 500 Ω/sq. or less, for example, in the range of about 1 to 500 Ω/sq.

The graphene electrode doped with the p-dopant having a reduced sheet resistance may have a work function in the range of about 4.5 to 5.5 eV.

The graphene electrode doped with the p-dopant may be a graphene sheet prepared by using a known method. When considering intrinsic light transmittance of graphene, about 1 to 10 layers, or about 1 to 4 layers of graphene may be used. The number of the graphene layers may be selected to have a desired light transmittance. In addition, multi-layered graphene may be prepared by sequentially stacking graphene mono-layers. If the p-dopant is doped on at least two graphene layers, the p-dopant may exist between the graphene layers.

The graphene doped with the p-dopant may be formed on at least one surface of a transparent substrate to form a transparent electrode. The transparent substrate may be a plastic substrate, or a glass substrate. A transparent flexible substrate may be used to provide flexibility to the transparent electrode. Examples of the transparent flexible substrate include polyethylene terephthalate (PET), polycarbonate (PC), polyimide (PI), polyethylene naphthalate (PEN), polystyrene (PS), and polyether sulfone (PES) substrates.

The transparent electrode including the doped graphene may have improved optical properties, electric properties, and relatively high stability when exposed to air, and may thus be applied to various display devices, e.g., organic light-emitting devices, e-paper, and liquid crystal display (LCD) devices, or solar cells.

The transparent electrode including graphene may be prepared using the following process.

Graphene may be transferred onto a transparent substrate to form a transparent electrode, and the graphene may be doped with a p-dopant solution to prepare a transparent electrode. The p-dopant may be an inorganic acid or an organic acid having a molecular weight of about 120 or greater, and a sheet resistance variation of the doped graphene after about 14 days from the doping process is about 25% or less.

The graphene may be prepared using any known method, for example, using a method including heat-treating a graphitization catalyst sheet with a gaseous or liquid carbon source at a predetermined or given temperature to form a graphene sheet on the surface of the catalyst, and separating the graphene sheet from the catalyst.

If the graphene is transferred onto a transparent substrate, a transparent electrode may be obtained. In this regard, graphene electrode having an about 1 to 10 layered, for example, about 1 to 4 layered structure, may be used in consideration of transmittance of the graphene. If a plurality of layers of graphene are formed on the transparent substrate, graphene mono-layers may be repeatedly stacked on the transparent substrate to obtain a desired number of graphene layers.

The transparent substrate may be a glass substrate or a plastic substrate. Examples of the plastic substrate may be a transparent flexible substrate, e.g., a polyethylene terephthalate (PET) substrate, a polycarbonate (PC) substrate, a polyimide (PI) substrate, a polyethylene naphthalate (PEN) substrate, and a polystyrene (PS) substrate.

As described above, the graphene may be transferred onto the transparent substrate to form the transparent electrode, and the graphene may be doped with a p-dopant solution.

The p-dopant solution used herein may be a solution prepared by dissolving or dispersing at least one p-dopant in a polar solvent. The polar solvent may be a solvent having a dielectric constant of about 5 or greater, for example, water, nitro methane, dimethylformamide, N-methyl-2-pyrrolidinone, tetrahydrofuran, acetonitrile, dimethyl sulfoxide, and ethanol.

The concentration of the p-dopant solution may determine the amount of dopant applied to the graphene. For example, the concentration of the p-dopant solution applied to a graphene mono-layer having a size of 1 cm×1 cm may be in the range of about 0.001M to 0.1M, for example, about 0.005M to 0.05M, for a sufficient doping effect and cost-effectiveness. As the number of the graphene layers increases, the concentration of the p-dopant solution increases.

The doping process of doping the graphene with the p-dopant may be performed by using a dipping process or a dropping process. To reduce manufacturing costs, the dropping process may be used. When the dropping process is used, about 0.025 ml to 0.175 ml of the p-dopant solution having the concentration described above may be applied to a graphene mono-layer having a size of 1 cm×1 cm to improve the doping effect and cost-effectiveness. When about 0.025 ml of about 0.001M dopant solution is used, about 0.000025 mmol of the dopant may be contained in 1 $cm^2$ of graphene. When about 0.175 ml of a about 0.1M dopant solution is used, about 0.0175 mmol of the dopant may be contained in 1 $cm^2$ of graphene.

After the doping process, a drying process may be performed to evaporate the organic solvent. The drying process may be naturally performed, or a mechanical dryer, e.g., a spin coater, may be used for an efficient drying process.

According to example embodiments, the process may further include acid-treating the transparent electrode including graphene after forming the transparent electrode and before the doping process. By performing the acid-treatment, the graphene may be polarized so that the doping of the graphene may be efficiently performed. The acid-treatment may be performed using an acid solution, e.g., hydrochloric acid, nitric acid, sulfuric acid, and phosphoric acid. The graphene transferred onto the transparent substrate may be immersed in the acid solution, or the acid solution may be directly sprayed or dropped onto the graphene. A drying process may be performed.

The transparent electrode including the doped graphene may be efficiently applied to display devices, e.g., organic light-emitting devices, LCD devices, and e-paper because sheet resistance may be reduced, transmittance may not be reduced, and stability may be improved when exposed to air. The transparent electrode may also be efficiently applied to solar cells, e.g., dye-sensitized solar cells and organic solar cells, and light-emitting diodes (LEDs).

Figure 1:
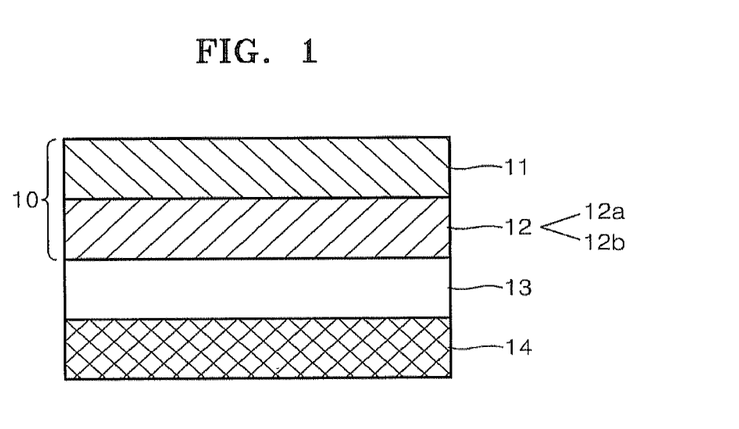
FIG. 1 is a schematic diagram of a dye-sensitized solar cell according to example embodiments.

A solar cell according to example embodiments including the transparent electrode including doped graphene may be a dye-sensitized solar cell as shown in FIG. 1. The dye-sensitized solar cell includes a semiconductor electrode 10, an electrolyte layer 13, and an opposite electrode 14, wherein the semiconductor electrode includes a conductive transparent substrate 11 and a light absorbing layer 12. The semiconductor electrode may be prepared by coating a colloidal solution of a nano-particulate oxide 12a on a conductive glass substrate, heating the coating in a hot electric furnace, and adsorbing a dye 12b thereto.

The conductive transparent substrate 11 may be the transparent electrode described above. The transparent electrode may be prepared by transferring a reduced product of oxidized graphene doped with a dopant onto a transparent substrate. The transparent substrate may be a substrate formed of a transparent polymer, e.g., a polyethylene terephthalate (PET), polycarbonate (PC), polyimide (PI), or polyethylene naphthalate (PEN), or a glass substrate, which is also applied to the opposite electrode 14.

If the dye-sensitized solar cell has a bendable structure, for example, a cylindrical structure, the opposite electrode 14 in addition to the transparent electrode may also be formed of a soft material.

The nano-particulate oxide 12a used in the solar cell may include semiconductor fine particles and may be an n-type semiconductor in which electrons charged under an excited state function act as a carrier providing an anode current. Examples of the nano-particulate oxide 12a may include $TiO_2$, $SnO_2$, $ZnO_2$, $WO_3$, $Nb_2O_5$, $Al_2O_3$, MgO, and $TiSrO_3$, for example, anatase type $TiO_2$. The above metal oxide is not limited thereto and may be used alone or in a combination of at least two thereof. The surface area of the semiconductor fine particles may be increased so that a light absorbing capacity of a dye adsorbed to the surface thereof may be increased. For this, the particle diameter of the semiconductor fine particles may be about 20 nm or less.

In addition, the dye 12b may be any dye commonly used in solar cells or photoelectric cells. For example, a ruthenium complex may be used. The ruthenium complex may be $RuL_2(SCN)_2$, $RuL_2(H_2O)_2$, $RuL_3$, or $RuL_2$, where L is 2,2'-bipyriydl-4,4'-dicarboxylate. The dye 12b may be any dye having a charge separation capability and a sensitization capability. Examples of the dye 12b include, but is not limited to, a xanthine based dye, e.g., rhodamine B, Rose Bengal, eosin, or erythrosine; a cyanine based dye, e.g., quinocyanin or cryptocyanine; a basic dye, e.g., phenosafranine, capri blue, thiosine, or methylene blue; a porphyrin based compound, e.g., chlorophyll, zinc porphyrin, or magnesium porphyrin; an azo dye; a phthalocyanine compound; a ruthenium tris-bipyridyl based complex compound; an anthraquinone based dye; a polycyclic quinone based dye in addition to a ruthenium complex; and these compounds may be used alone or in a combination of at least two thereof.

The thickness of the light absorbing layer 12 including the nano-particulate oxide 12a and the dye 12b may be less than about 15 µm, for example, in the range of about 1 to 15 µm. The light absorbing layer 12 may have relatively high series resistance. As the series resistance increases, conversion efficiency decreases. Thus, if the thickness of the light absorbing layer 12 is less than about 15 µm, a relatively low series resistance may be maintained so that the reduction in conversion efficiency may be prevented or inhibited.

The electrolyte layer 13 used in the dye-sensitized solar cell may be a liquid electrolyte, an ionic liquid electrolyte, a solid electrolyte, or a complex thereof. The electrolyte layer 13 mainly includes an electrolyte. The electrolyte layer 13 may include the light absorbing layer 12 or the electrolyte may be infiltrated in the light absorbing layer 12. The electrolyte may be iodine or acetonitrile, but is not limited thereto. The electrolyte may be any electrolyte having a hole transferring capability without limitation.

The dye-sensitized solar cell may further include a catalyst layer. The catalyst layer may be used to promote a redox reaction of the dye-sensitized solar cell and may include platinum, carbon, graphite, carbon nanotubes, carbon black, a p-type semiconductor, or a complex thereof. The catalyst layer may be interposed between the electrolyte layer 13 and the opposite electrode 14. The surface area of the catalyst layer may be increased by using a microstructure. For example, platinum black or porous carbon may be used. The platinum black may be prepared by anodic oxidation of platinum, or treatment with chloroplatinic acid, and the porous carbon may be prepared by calcining carbon particles or sintering an organic polymer.

The dye-sensitized solar cell may have improved optical efficiency and relatively high processability by using the transparent electrode including the highly conductive and flexible graphene sheet.

A display device including the transparent electrode including doped graphene may be e-paper, an organic light-emitting display device, or an LCD device. An organic light-emitting display device is an active type light-emitting display device in which a current is applied to a fluorescent or phosphorescent organic compound thin layer. Electrons may be combined with holes in the organic layer, thereby emitting light. An organic light-emitting display device includes an anode, a hole transport layer (HTL), an emission layer, an electron transport layer (ETL) and a cathode, which are sequentially formed on a substrate. In order to easily inject electrons and holes, the organic light-emitting display device may further include an electron injection layer (EIL) and a hole injection layer (HIL). If desired, a hole blocking layer (HBL) and a buffer layer may further be included. Because the anode is formed of a transparent material having higher conductivity, the transparent electrode including the graphene sheet according to example embodiments may be efficiently used.

The material used to form the HTL may be any known hole transporting material, for example, polytriphenylamine, but is not limited thereto.

The material used to form the ETL may be any known electron transporting material, for example, polyoxadiazole, but is not limited thereto.

The material used to form the emission layer may be any known fluorescent or phosphorescent material without limitation and may include at least one selected from the group consisting of a higher molecular weight host, a mixture of a higher molecular weight host and a lower molecular weight host, a lower molecular weight host, and a non-emissive polymer matrix. In this regard, the higher molecular weight host, the lower molecular weight host, and the non-emissive polymer matrix may be any compounds that are commonly used in the art to form an emission layer of the organic light-emitting device. Examples of the high molecular weight host include, but are not limited to, poly(vinylcarbazole), polyfluorene, poly(p-phenylene vinylene), and polythiophene. Examples of the low molecular weight host include, but are not limited to, 4,4'-N,N'-dicarbozole-biphenyl (CBP), 4,4'-bis[9-(3,6-biphenylcarbazolyl)]-1-1,1'-biphenyl{4,4'-bis[9-(3,6-biphenylcarbazolyl)]-1-1,1'-biphenyl}, 9,10-bis[(2',7'-t-butyl)-9',9''-spirobifluorenyl anthracene, and tetrafluorene. Examples of the non-emissive polymer matrix include, but are not limited to, polymethyl methacrylate and polystyrene. The emission layer may be formed by using vacuum deposition, sputtering, printing, coating, or inkjet printing.

The organic light-emitting device according to example embodiments may be manufactured by using a method that is commonly used in the art without limitation.

Hereinafter, example embodiments will be described in more detail with reference to the following examples. However, these examples are not intended to limit the scope of example embodiments.

Preparation Example 1: Preparation of Graphene Transparent Electrode

A Cu foil (75 μm, manufactured by Wacopa) was disposed in a chamber and heat-treated at 1,000° C. by making $H_2$ flow at 4 sccm for about 30 minutes. Then, $CH_4$ (20 sccm) and $H_2$ (4 sccm) were made to flow for about 30 minutes, and the chamber was naturally cooled to form a graphene mono-layer having a size of 2 cm×2 cm.

Then, a chlorobenzene solution (about 5 wt %) in which polymethyl methacrylate (PMMA) was dissolved was coated on the substrate on which the graphene sheet is formed at about 1,000 rpm for about 60 seconds. The resultant was immersed in an etchant (CE-100, manufactured by Transen Co. Inc.) for about 1 hour to remove the Cu foil, resulting in isolating the graphene sheet to which the PMMA is attached. The graphene sheet to which the PMMA is attached was collected from the etchant and dried on a plastic substrate (PEN, manufactured by DuPont Teijin). Then the PMMA was removed using acetone to obtain a transparent electrode including a graphene mono-layer formed on the substrate.

Transparent electrodes having about 2, 3, and 4 layers of graphene were respectively prepared by repeating a process including stacking the graphene sheet to which the PMMA is attached on the graphene transparent electrode and removing the PMMA by using acetone.

Preparation Example 2

A Cu foil (75 μm, manufactured by Wacopa) was disposed in a chamber and heat-treated at 1,000° C. by making $H_2$ flow at about 4 sccm for about 30 minutes. Then, $CH_4$ (20 sccm) and $H_2$ (4 sccm) were made to flow for 30 minutes, and the chamber was naturally cooled to form a graphene mono-layer having a size of 1.5 cm×1.5 cm.

Then, a chlorobenzene solution (about 5 wt %) in which polymethyl methacrylate (PMMA) was dissolved was coated on the substrate on which the graphene sheet is formed at about 1,000 rpm for about 60 seconds. The resultant was immersed in an etchant (CE-100, manufactured by Transen Co. Inc.) for about 1 hour to remove the Cu foil, resulting in isolating the graphene sheet to which the PMMA is attached. The graphene sheet to which the PMMA is attached was collected from the etchant and dried on a plastic substrate (PEN, manufactured by DuPont Teijin). Then, the PMMA was removed using acetone to obtain a transparent electrode including a graphene mono-layer formed on the substrate.

Preparation Example 3

A Cu foil (75 μm, manufactured by Wacopa) was disposed in a chamber and heat-treated at about 1,005° C. by making $H_2$ flow at about 4 sccm for about 2 hours. Then, $CH_4$ (20 sccm) and $H_2$ (4 sccm) were made to flow for about 20 minutes, and the chamber was naturally cooled to form a graphene mono-layer having a size of 1.5 cm×1.5 cm.

Then, a chlorobenzene solution (about 5 wt %), in which polymethyl methacrylate (PMMA) was dissolved, was coated on the substrate on which the graphene sheet is formed at about 1,000 rpm for about 60 seconds. The resultant was immersed in an etchant (CE-100, manufactured by Transen Co. Inc.) for about 1 hour to remove the Cu foil, resulting in isolating the graphene sheet to which the PMMA is attached. The graphene sheet to which the PMMA is attached was collected from the etchant and dried on a plastic substrate (PEN, manufactured by DuPont Teijin). Then, the PMMA was removed using acetone to obtain a transparent electrode including a graphene mono-layer formed on the substrate.

A transparent electrode having about 4 layers of graphene was prepared by repeating a process including stacking the graphene sheet to which the PMMA is attached on the graphene transparent electrode and removing the PMMA by using acetone.

Example 1

About 0.4 ml of about 0.01M TFSI solution prepared by dissolving bis(trifluoromethane)sulfonimide (TFSI, ($CF_3SO_2)_2NH$, manufactured by Aldrich) in nitromethane (manufactured by Aldrich) was dropped on the transparent electrodes respectively including 1, 2, 3, and 4 layers of graphene prepared in Preparation Example 1, and the graphene transparent electrodes were maintained for 5 minutes and dried at about 2,000 rpm for about 30 seconds using a spin coater.

Example 2

The transparent electrode including the graphene mono-layer to which the PMMA is attached in Preparation Example 1 was doped with about 0.4 ml of the about 0.01M TFSI solution as described in Example 1. Then, a graphene sheet (mono-layer) to which the PMMA is attached was further stacked thereon, and the PMMA was removed using acetone. Then, the resultant was doped with about 0.4 ml of the about 0.01M TFSI solution as described in Example 1. A transparent electrode including about 4 layers of doped graphene was prepared by repeating twice a process including stacking the graphene, removing the PMMA, and doping the graphene.

Example 3

The transparent electrode including four layers of graphene prepared in Preparation Example 1 was immersed in about 48.8% $HNO_3$ solution for 5 minutes and dried, and then doped with about 0.4 ml of about 0.05M TFSI solution to prepare a doped transparent electrode.

Example 4

The transparent electrode including four layers of graphene prepared in Preparation Example 3 was doped with about 0.4 ml of about 0.05M TFSI solution as described in Example 1 to prepare a doped transparent electrode.

Example 5

About 0.25 ml of about 0.01M TFSI solution was dropped on the transparent electrode having the graphene mono-layer prepared in Preparation Example 2, and the graphene transparent electrode was maintained for about 5 minutes and dried at about 2,000 rpm for about 30 seconds using a spin coater.

Example 6

About 0.25 ml of about 0.01M solution prepared by dissolving trifluoromethane sulfonamide ($CF_3SO_2NH_2$, manufactured by Aldrich) in nitromethane (manufactured by Aldrich) was dropped on the transparent electrode having the graphene mono-layer prepared in Preparation Example 2, and the graphene transparent electrode was maintained for about 5 minutes and dried at about 2,000 rpm for about 30 seconds using a spin coater.

Example 7

About 0.25 ml of about 0.01M solution prepared by dissolving trifluoromethane sulfonic acid anhydride (($CF_3SO_2)_2O$, manufactured by Aldrich) in nitromethane (manufactured by Aldrich) was dropped on the transparent electrode having the graphene mono-layer prepared in Preparation Example 2, and the graphene transparent electrode was maintained for 5 minutes and dried at about 2,000 rpm for about 30 seconds using a spin coater.

Example 8

About 0.25 ml of about 0.01M solution prepared by dissolving anhydride of trifluoroacetate and trifluoromethane sulfonic acid ($CF_3SO_3COCF_3$, manufactured by Aldrich) in nitromethane (manufactured by Aldrich) was dropped on the transparent electrode having the graphene mono-layer prepared in Preparation Example 2, and the graphene transparent electrode was maintained for 5 minutes and dried at about 2,000 rpm for about 30 seconds using a spin coater.

Example 9

About 0.25 ml of about 0.01M solution prepared by dissolving trifluoroacetate anhydride (($CF_3CO)_2O$, manufactured by Aldrich) in nitromethane (manufactured by Aldrich) was dropped on the transparent electrode having the graphene mono-layer prepared in Preparation Example 2, and the graphene transparent electrode was maintained for 5 minutes and dried at about 2,000 rpm for about 30 seconds using a spin coater.

Comparative Example 1

About 0.4 ml of about 0.01M $AuCl_3$ solution prepared by dissolving $AuCl_3$ in nitromethane (manufactured by Aldrich) was dropped on the transparent electrodes respectively having 1, 2, 3, and 4 layers of graphene prepared in Preparation Example 1, and the graphene transparent electrodes were maintained for about 5 minutes and dried at about 2,000 rpm for about 30 seconds using a spin coater.

Comparative Example 2

About 0.4 ml of about 0.01M $AuCl_3$ solution was dropped on the transparent electrode including 4 layers of graphene prepared in Preparation Example 3, and the graphene transparent electrode was maintained for about 5 minutes and dried to prepare a transparent electrode doped with $AuCl_3$.

Comparative Example 3

The transparent electrode including 4 layers of graphene prepared in Preparation Example 3 was immersed in about 0.4 ml of about 48.8% $HNO_3$ solution, and the graphene transparent electrode was maintained for about 5 minutes and dried to prepare a transparent electrode doped with $HNO_3$.

Experimental Example 1

Transmittance and sheet resistance of the graphene transparent electrode prepared in Preparation Example 1, the transparent electrode including the doped graphene prepared in Example 1, and the transparent electrode including the doped graphene prepared in Comparative Example 1 was measured right after the doping process, and the results are shown in Table 1 below.

TABLE 1

| No. of graphene layers | Preparation Example 1 | | Example 1 | | Comparative Example 1 | |
|---|---|---|---|---|---|---|
| | % T @ 550 nm | Sheet resistance (Ω/sq.) | % T @ 550 nm | Sheet resistance (Ω/sq.) | % T @ 550 nm | Sheet resistance (Ω/sq.) |
| 1 | 97.6 | 470.2 | 97.6 | 334.2 | 97.1 | 269.7 |
| 2 | 94.6 | 295.3 | 94.7 | 142.8 | 94.1 | 111.0 |
| 3 | 92.7 | 201.7 | 92.5 | 111.6 | 92.0 | 80.1 |
| 4 | 90.4 | 190.3 | 90.4 | 95.6 | 89.7 | 84.6 |

The transmittance was obtained by measuring visible light transmittance using an UV-Vis spectrometer and comparing the result with transmittance at about 550 nm %, and the sheet resistance was measured using a 4 point probe method.

As shown in Table 1, sheet resistance of the transparent electrode prepared in Example 1 was lower than that of the transparent electrode including the undoped graphene prepared in Preparation Example 1. Thus, the transparent electrode of Example 1 has an effective doping effect. The transmittance of the transparent electrode prepared in Example 1 was similar to that prepared in Preparation Example 1. However, although sheet resistance of the transparent electrode doped with $AuCl_3$ prepared in Comparative Example 1 was lower than the transparent electrode doped with TFSI prepared in Example 1, transmittance of the transparent electrode of Comparative Example 1 was also reduced by about 0.5% or more. Thus, it is apparent that optical properties of the transparent electrode of Comparative Example 1 deteriorated.

Experimental Example 2

Sheet resistance of the transparent electrode including 4 layers of graphene prepared in Preparation Example 1, the transparent electrode including 4 layers of doped graphene prepared in Example 1, the transparent electrode including 4 layers of doped graphene (stacked) prepared in Example 2, the transparent electrode including 4 layers of doped graphene (doping after acid-treatment) prepared in Example 3, the transparent electrode including 4 layers of doped graphene prepared in Example 4, and the transparent electrodes including 4 layers of doped graphene prepared in Comparative Examples 2 and 3 were measured right after the doping process, and the results are shown in Table 2 below.

TABLE 2

| | Dopant | Sheet resistance |
|---|---|---|
| Preparation Example 1 | Undoped | 190.3 |
| Example 1 | TFSI 0.01M | 95.6 |
| Example 2 | TFSI 0.01M LBL | 66.4 |
| Example 3 | acid TFSi 0.05M | 50.5 |
| Example 4 | TFSI 0.05M | 47.8 |
| Comparative Example 2 | $AuCl_3$ | 49.6 |
| Comparative Example 3 | $HNO_3$ | 53.5 |

As shown in Table 2, although sheet resistance of the transparent electrode doped with the about 0.01M $AuCl_3$ solution prepared in Comparative Example 1 was lower than that of the transparent electrode including undoped graphene prepared in Preparation Example 1, transmittance of the transparent electrode of Comparative Example 1 was also reduced from 90.35% to 89.67%. Thus, it is apparent that optical properties of the transparent electrode of Comparative Example 1 deteriorated. Sheet resistance of the transparent electrodes including the graphene doped with TFSI prepared in Examples 1 to 3 was reduced. Transmittance thereof was similar to that of the transparent electrode including the undoped graphene prepared in Preparation Example 1. Sheet resistance of the transparent electrode doped by using a layer-by-layer method prepared in Example 2 and the transparent electrode doped after acid-treatment prepared in Example 3 to improve performance more than the doping with $AuCl_3$ by improving TFSI adsorption was lower than the transparent electrode doped with $AuCl_3$ prepared in Comparative Example 1 without a change in transmittance. In addition, sheet resistance of the transparent electrode prepared in Example 4 in which the concentration of the dopant was increased was similar to or lower than that of the transparent electrode prepared in Comparative Example 2.

Experimental Example 3

Sheet resistance per hour of the undoped transparent electrode prepared in Preparation Example 1 and the transparent electrodes prepared in Examples 1 to 4, and Comparative Example 2 was measured in order to evaluate stability when exposed to air, and the results are shown in Table 3 below. The graphene of Example 1 has 4 layers of graphene.

TABLE 3

| | Dopant | Sheet resistance right after doping ($R_0$) | Sheet resistance after 14 days (R) | Sheet resistance variation rate $(R - R_0)/R_0 * 100$ (%) |
|---|---|---|---|---|
| Preparation Example 1 | Undoped | 190.3 | 190.3 | 0.0 |
| Example 1 | TFSI 0.01M | 95.6 | 112.8 | 18.0 |
| Example 2 | TFSI 0.01M LBL | 66.4 | 77.7 | 17.1 |
| Example 3 | AcidTFSi 0.05M | 50.5 | 57.3 | 13.5 |
| Example 4 | TFSI 0.05M | 47.8 | 47.6 | −0.5 |
| Comparative Example 3 | $HNO_3$ | 53.5 | 72.1 | 34.7 |
| Comparative Example 2 | $AuCl_3$ | 49.6 | 62.5 | 26.0 |

Sheet resistance of the graphene transparent electrode doped with $HNO_3$ prepared in Comparative Example 2 was increased by about 35%, sheet resistance of the transparent electrodes prepared in the other examples was increased by less than about 25%. In particular, sheet resistance of the transparent electrode doped with 0.05M TFSI prepared in Example 4 was stable over time.

Experimental Example 4

Figure 2:
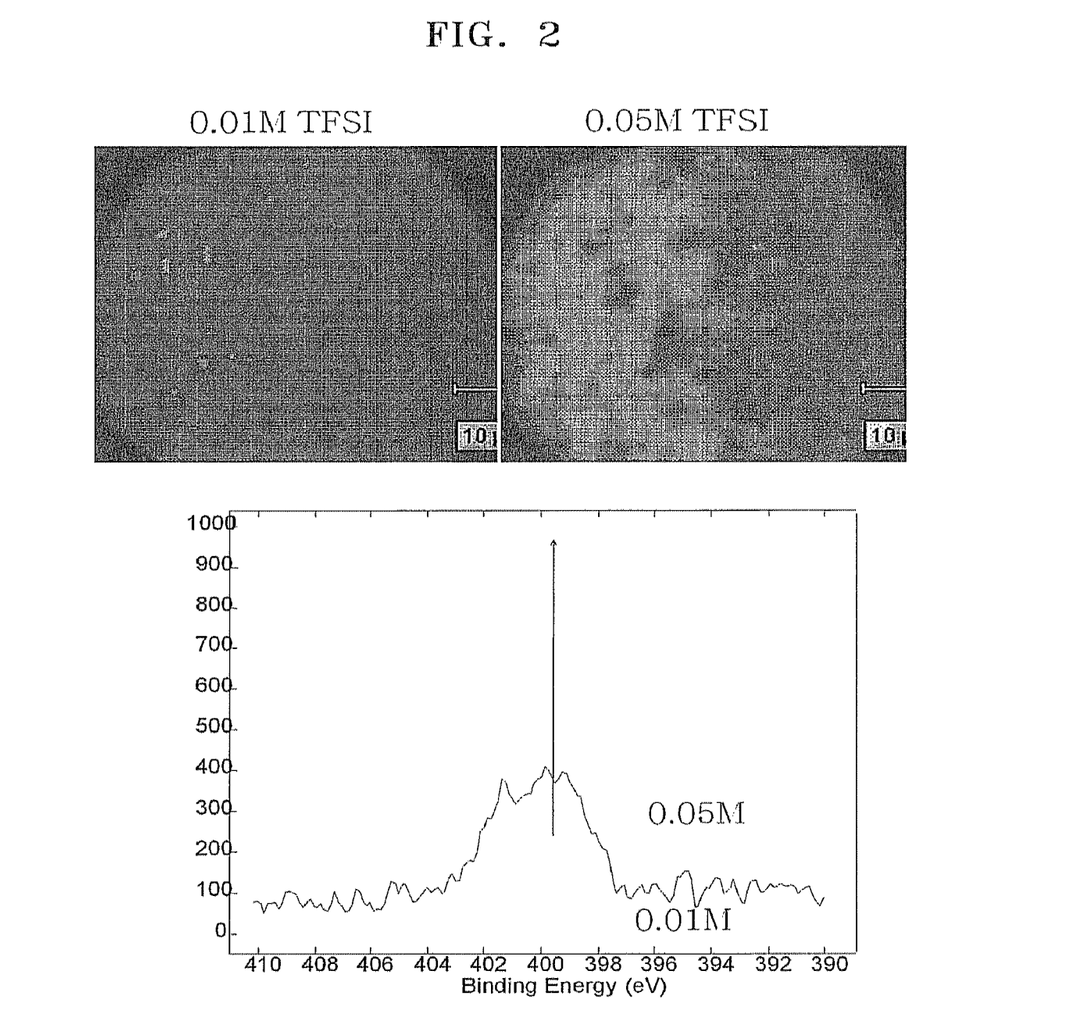
FIG. 2 shows optical photographs of the surface of transparent electrodes prepared in Examples 1 and 4 and a graph illustrating results of an XPS spectrum of the transparent electrodes.

Optical photographs of the surface of the transparent electrodes including 4 layers of doped graphene prepared in Examples 1 and 4 were taken (1000×), and the results are shown in FIG. 2, and the XPS results thereof are shown in FIG. 2.

Sheet resistance in Example 4 is stable due to an increased coverage of the doped dopant that functions as a passivation layer of the transparent electrode having the doped graphene as shown in the optical photographs of FIG. 2. In addition, a relative intensity of N1s core peak around 400 eV in XPS. Thus, the undoped TFSI that remains on the surface of graphene functions as a passivation layer.

Experimental Example 5

Figure 3:
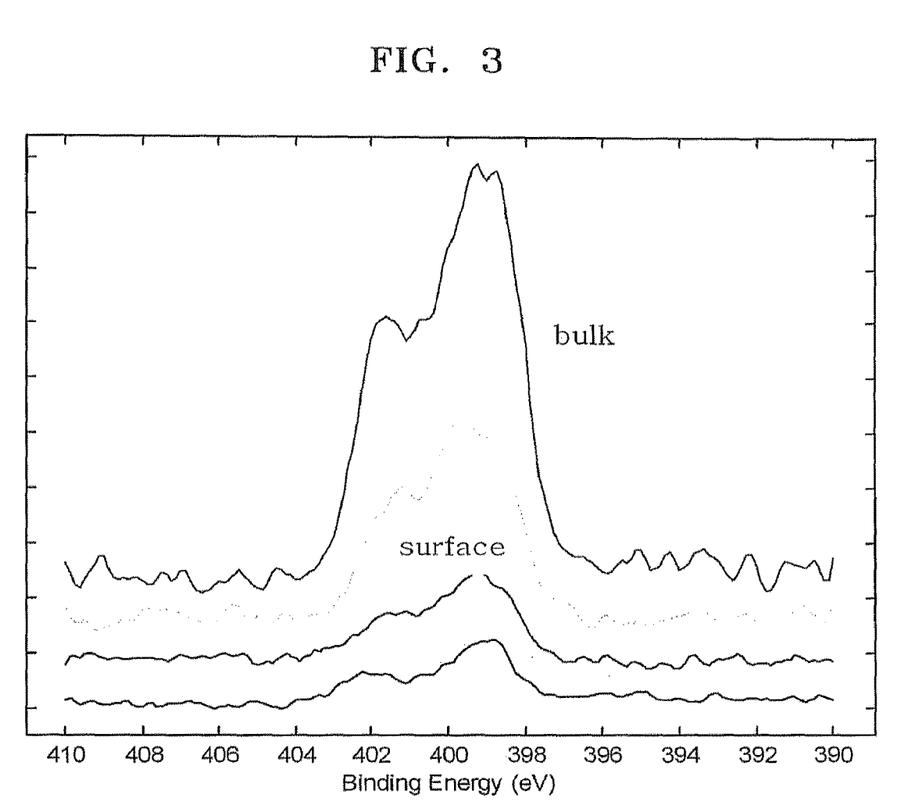
FIG. 3 is a graph illustrating results of an XPS spectrum of a transparent electrode prepared in Example 4.

FIG. 3 is a graph illustrating results of an XPS spectrum of a transparent electrode obtained in Example 4.

As shown in FIG. 3, intensity increased toward a bulk in the spectrum at N1s measured while changing angles in XPS. Thus, the dopant is not only adsorbed on the surface of the transparent electrode having graphene doped with TFSI but is also interposed between the graphene layers.

Experimental Example 6

Figure 4:
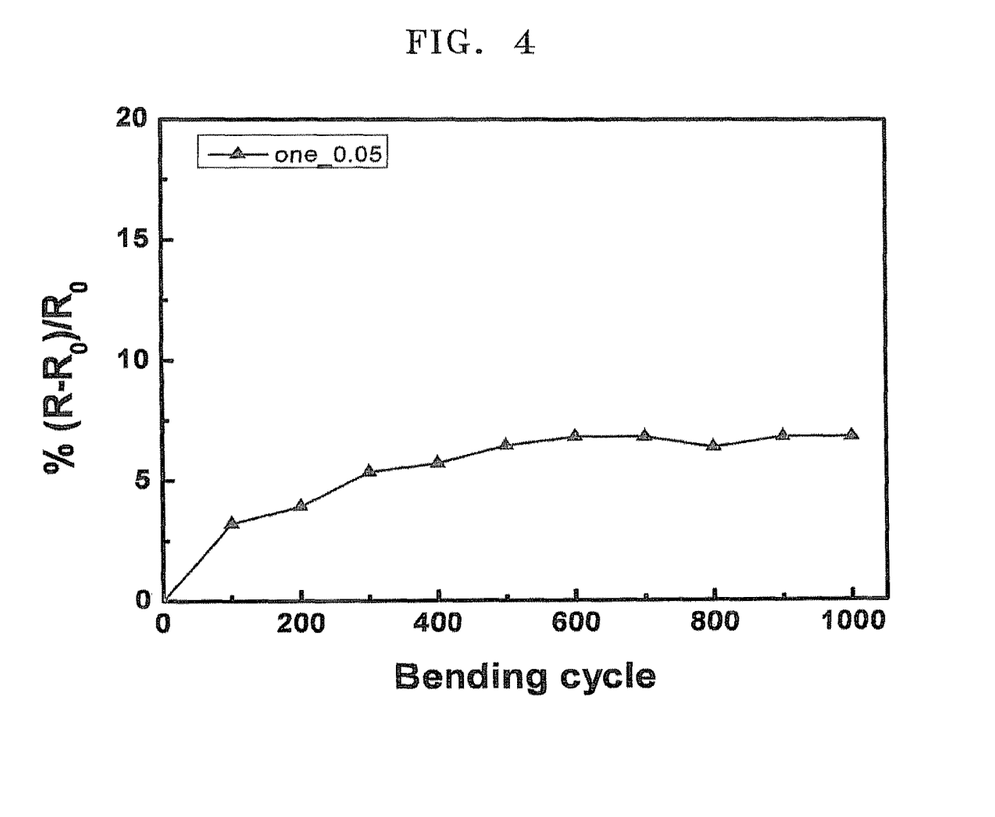
FIG. 4 is a graph illustrating sheet resistance variation of a transparent electrode prepared in Example 4 with respect to the number of times bending is performed.

Sheet resistance of the transparent electrode having graphene doped with the 0.05M TFSI prepared in Example 4 was measured after being bent 100 times at 1 Hz at 1% strain. FIG. 4 shows sheet resistance variation of the transparent electrode after being bent 1000 times (repeating 10 times). As shown in FIG. 4, the sheet resistance variation rate was about 10% or less. Accordingly, the performance of graphene as a flexible transparent electrode may be evaluated.

Experimental Example 7

Sheet resistance of the doped transparent electrode prepared in Examples 6 to 10 was measured before and after the doping process in order to evaluate the doping effect of the dopant.

TABLE 4

| Dopant | Sheet resistance before doping ($R_1$) | Sheet resistance right after doping ($R_2$) | sheet resistance variation rate ($R_2 - R_1$)/ $R_1$ * 100) (%) |
|---|---|---|---|
| Example 5 $(CF_3SO_2)_2NH$ | 580 | 228 | −60.6 |
| Example 6 $CF_3SO_2NH_2$ | 656 | 454 | −30.8 |
| Example 7 $(CF_3SO_2)_2O$ | 690 | 269 | −61.0 |
| Example 8 $CF_3SO_3COCF_3$ | 658 | 286 | −56.6 |
| Example 9 $(CF_3CO)_2O$ | 609 | 459 | −24.7 |

As shown in Table 4, sheet resistance of the transparent electrodes prepared in Examples 5 to 9 was reduced by doping using the imide-based dopant, the amide-based dopant, and the anhydride dopant, and the sheet resistance reduction rate of the transparent electrodes prepared in Examples 5 to 9 was 20% or greater.

Example 11: Preparation of Solar Cell

A paste of titanium oxide particles having a particle size of 7 to 25 nm was coated on a transparent electrode prepared in Example 4 over an area of 4 cm$^2$, and the resultant was calcined at a low temperature (at about 150° C. or less) to prepare a porous titanium oxide layer having a thickness of about 15 μm. Then, a dye adsorbing treatment was performed in about 0.3 mM solution of Ru(4,4'-dicarboxy-2, 2'-bipyridine)$_2$(NCS)$_2$ dissolved in ethanol for about 12 hours or longer at room temperature. Then, the porous titanium oxide layer, on which the dye was adsorbed, was washed using ethanol and dried at room temperature to prepare a photocathode.

A Pt reduction electrode was deposited on a transparent electrode according to Example 1 by sputtering and a microhole was formed using a drill having a diameter of about 0.75 mm for injection of an electrolyte to prepare an opposite electrode.

The photocathode and the opposite electrode were combined by placing a 60 μm thick thermoplastic polymer film between the photocathode and the opposite electrode and pressing them at 100? for 9 seconds. An oxidation-reduction electrolyte was injected via the microhole formed in the opposite electrode and the microhole was blocked using a cover glass and a thermoplastic polymer film to prepare a dye-sensitized solar cell. In this regard, the oxidation-reduction electrolyte was a solution in which 21.928 g of tetrapropylammonium iodide and 1.931 g of I$_2$ were dissolved in a solvent having about 80% ethylene carbonate and about 20% acetonitrile.

Example 12: Preparation of Organic Light-Emitting Device

An electrode pattern was formed on the transparent electrode according to Example 4 and washed. PEDOT was coated on the washed transparent electrode to a thickness of about 50 nm, and the resultant was baked at about 120° C. for about 5 minutes to prepare a hole injection layer.

Arctic Green 223 polymer (manufactured by Shepherd Color Company) was spin coated on a HIL, and baked at 100° C. for 1 hour. A solvent was completely removed in a vacuum oven to form an emission layer with a thickness of about 80 nm.

Then, Alq$_3$ was vacuum deposited on the polymer emitting layer using a vacuum depositor at about 1.0 Å/sec while maintaining the vacuum level at 4×10$^{-6}$ torr or less to form an ETL with a thickness of about 30 nm. LiF was vacuum deposited at about 10.1 Å/sec to form an EIL with a thickness of about 5 nm.

Then, Al was vacuum deposited at about 10 Å/sec to form a cathode with a thickness of about 200 nm, and the resultant was encapsulated to prepare an organic light-emitting device. The encapsulation was performed by adding BaO powder into a glove box under a dry nitrogen gas atmosphere, sealing the glove box using a metal can, and treating the resultant with a UV-curing agent.

As described above, according to example embodiments, the transparent electrode including graphene doped with the p-dopant has relatively low sheet resistance and relatively high stability when exposed to air without reducing transmittance, and thus may be efficiently applied to a variety of display devices.

It should be understood that example embodiments described herein should be considered in a descriptive sense only and not for purposes of limitation. Descriptions of features or aspects within each example embodiment should typically be considered as available for other similar features or aspects in other example embodiments.

What is claimed is:

1. A transparent electrode comprising graphene on at least one surface of a transparent substrate, the graphene doped with a p-dopant,
   wherein the p-dopant is an acid having a molecular weight of about 120 or more,
   wherein a transmittance variation rate of the doped graphene from before and after the graphene is doped with the p-dopant is about 0.5% or less,
   wherein the acid is an inorganic acid or an organic acid, wherein the organic acid includes at least one of oxalic acid-based organic acid, lactic acid-based organic acid, propionic acid-based organic acid, acetic acid-based organic acid, citric-based organic acid and trifluoroacetate-based organic acid, wherein the inorganic acid includes at least one of triflate-based inorganic acid, trifluorosulfonimide-based inorganic acid, tetrafluoroborate-based inorganic acid, perchlorate-based inorganic acid, hexafluorophosphate-based inorganic acid, fluoroantimonate-based inorganic acid, silver-based inorganic acid, and tellurium-based inorganic acid, and wherein the silver-based inorganic acid includes at least one of silver bis(trifluoromethane sulfonimide), silver sulfate, silver thiocyanate, silver hexafluorophosphate, silver hexafluoroantimonate, silver hexafluoroarcenate, silver cyanide, silver tetrafluoroborate, and silver perchlorate.

2. The transparent electrode of claim 1, wherein
the acid is the inorganic acid, and
carbon atoms contained in the inorganic acid are saturated carbon atoms bonded to each other by single bonds.

3. The transparent electrode of claim 1, wherein the one of triflate-based inorganic acid, trifluorosulfonimide-based inorganic acid, tetrafluoroborate-based inorganic acid, perchlorate-based inorganic acid, hexafluorophosphate-based inorganic acid, fluoroantimonate-based inorganic acid, and tellurium-based inorganic acid includes at least one of scandium (III) triflate, trifluoromethane sulfonic acid anhydride, bis(trifluoromethane)sulfonimide, bis(trifluoromethane)sulfonimide lithium, bis(pentafluoroethylsulfonyl) imide, nitrosyl bis(trifluoromethane)sulfonimide, trifluoromethanesulfonamide, 2,2,2-trichloroethoxysulfonamide, nitrosyl tetrafluoroborate, nitronium tetrafluoroborate, potassium hexafluorophosphate, hexafluorophosphoric acid, lithium hexafluorophosphate, fluoroantimonate, nitronium hexafluoroantimonate, nitrosodium hexafluoroantimonate, potassium hexafluoroantimonate, fluorosulfuric acid-antimony pentafluoride, teflic acid, and telluric acid.

4. The transparent electrode of claim 1, wherein
the acid is the organic acid, and
carbon atoms contained in the organic acid are bonded to each other by single bonds.

5. The transparent electrode of claim 1, wherein
the acid is the organic acid, and
the organic acid includes at least one of oxalic acid-based organic acid, lactic acid-based organic acid, propionic acid-based organic acid, acetic acid-based organic acid, citric acid-based organic acid and trifluoroacetate-based organic acid.

6. The transparent electrode of claim 1, wherein
the acid is the organic acid, and
the organic acid includes at least one of oxalyl chloride, oxalyl bromide, silver lactate, silver pentafluoropionate, methyl chlorooxoacetate, ethyl chlorooxoacetate, citric acid, lithium citrate, potassium citrate, zinc citrate, cesium trifluoroacetate, ethyl trifluoroacetate, trifluoroacetate anhydride, and silver trifluoroacetate.

7. The transparent electrode of claim 1, wherein
the acid is the inorganic acid, and
the inorganic acid comprises a metal ion having d-orbitals filled with electrons.

8. The transparent electrode of claim 1, wherein the molecular weight of the acid is in a range of about 120 to 400.

9. The transparent electrode of claim 1, wherein the graphene is treated with an acid different from the p-dopant.

10. The transparent electrode of claim 1, wherein light transmittance of the graphene doped with the p-dopant is about 75% or greater.

11. The transparent electrode of claim 1, wherein a sheet resistance variation rate after 14 days from the doping of the graphene with the p-dopant is about 20% or less.

12. The transparent electrode of claim 1, wherein the doped graphene has a sheet resistance reduction rate of about 20% or less, and
wherein the sheet resistance reduction rate is calculated by using the following equation:

Sheet resistance reduction rate (%)=absolute value of {(sheet resistance of graphene right after the graphene is doped with the $p$-dopant–sheet resistance of graphene before the graphene is doped with the $p$-dopant)/100}.

13. The transparent electrode of claim 1, wherein an amount of the p-dopant remains on the surface of the graphene.

14. The transparent electrode of claim 1, wherein the p-dopant not doped into the graphene forms a surface coating layer on the surface of the transparent substrate.

15. The transparent electrode of claim 1, wherein the graphene is composed of 1 to 10 stacked layers.

16. The transparent electrode of claim 1, wherein the graphene is composed of 2 to 10 stacked layers, and the p-dopant is between the graphene layers.

17. The transparent electrode of claim 1, wherein sheet resistance of the graphene doped with the p-dopant is about 500 Ω/sq. or less.

18. The transparent electrode of claim 1, wherein the graphene is formed as a mono layer having a size of 1 cm×1 cm, and the amount of the p-dopant (in the graphene mono-layer is in a range of about 0.000025 to 0.0175 mmol.

19. The transparent electrode of claim 1, wherein the transparent electrode is formed of a flexible material.

20. A solar cell comprising the transparent electrode according to claim 1.

21. A display device comprising the transparent electrode according to claim 1.

22. A process of preparing a transparent electrode, the process comprising:
forming a transparent electrode by transferring graphene onto a transparent substrate; and
doping the graphene with a p-dopant solution to obtain doped graphene,
wherein the p-dopant solution is an acid having a molecular weight of about 120 or greater, and
wherein a transmittance variation rate of the graphene from before and after the graphene is doped with the p-dopant solution is about 0.5% or less,
wherein the acid is an inorganic acid or an organic acid,
wherein the organic acid includes at least one of oxalic acid-based organic acid, lactic acid-based organic acid, propionic acid-based organic acid, acetic acid-based organic acid, citric acid-based organic acid and trifluoroacetate-based organic acid,
wherein the inorganic acid includes at least one of triflate-based inorganic acid, trifluorosulfonimide-based inorganic acid, tetrafluoroborate-based inorganic acid, perchlorate-based inorganic acid, hexafluorophosphate-based inorganic acid, fluoroantimonate-based inorganic acid, silver-based inorganic acid, and tellurium-based inorganic acid, and
wherein the silver-based inorganic acid includes at least one of silver bis(trifluoromethane sulfonimide), silver sulfate, silver thiocyanate, silver hexafluorophosphate, silver hexafluoroantimonate, silver hexafluoroarcenate, silver cyanide, silver tetrafluoroborate, and silver perchlorate.

23. The process of claim 22, wherein the graphene is formed as mono-layers, and a concentration of the p-dopant solution is in a range of about 0.001 to 0.1M per graphene mono-layer.

24. The process of claim 22, wherein the graphene is formed as mono-layers, and a concentration of the p-dopant solution is in a range of about 0.005 to 0.05M per graphene mono-layer.

25. The process of claim 22, wherein the graphene is formed as mono-layers, and an amount of the p-dopant solution is in a range of about 0.025 ml to 0.175 ml per graphene mono-layer having a size of 1 cm×1 cm.

26. The process of claim 22, after the forming the transparent electrode and before the doping the graphene, further comprising:
acid-treating the transparent electrode including the graphene.

27. A thin film comprising graphene on at least one surface of a transparent substrate, the graphene doped with a p-dopant,
wherein the p-dopant is an acid having a molecular weight of about 120 or greater, and
wherein a transmittance variation rate of the graphene from before and after the graphene is doped with the p-dopant is about 0.5% or less,
wherein the acid is an inorganic acid or an organic acid,
wherein the organic acid includes at least one of oxalic acid-based organic acid, lactic acid-based organic acid, propionic acid-based organic acid, acetic acid-based organic acid, citric acid-based organic acid and trifluoroacetate-based organic acid,
wherein the inorganic acid includes at least one of triflate-based inorganic acid, trifluorosulfonimide-based inorganic acid, tetrafluoroborate-based inorganic acid, perchlorate-based inorganic acid, hexafluorophosphate-based inorganic acid, fluoroantimonate-based inorganic acid, silver-based inorganic acid, and tellurium-based inorganic acid, and
wherein the silver-based inorganic acid includes at least one of silver bis(trifluoromethane sulfonimide), silver sulfate, silver thiocyanate, silver hexafluorophosphate, silver hexafluoroantimonate, silver hexafluoroarcenate, silver cyanide, silver tetrafluoroborate, and silver perchlorate.

28. The transparent electrode of claim 1, wherein the organic acid comprises a metal ion having d-orbitals filled with electrons.

* * * * *